(12) United States Patent
Blakely et al.

(10) Patent No.: US 9,406,594 B2
(45) Date of Patent: Aug. 2, 2016

(54) LEADFRAME BASED LIGHT EMITTER COMPONENTS AND RELATED METHODS

(71) Applicant: Cree, Inc., Durham, NC (US)

(72) Inventors: Colin Kelly Blakely, Franklinton, NC (US); Jesse Colin Reiherzer, Wake Forest, NC (US); Arthur Fong-Yuen Pun, Durham, NC (US)

(73) Assignee: Cree, Inc., Durham, NC (US)

(*) Notice: Subject to any disclaimer, the term of this patent is extended or adjusted under 35 U.S.C. 154(b) by 0 days.

(21) Appl. No.: 14/550,443

(22) Filed: Nov. 21, 2014

(65) Prior Publication Data

US 2016/0148860 A1 May 26, 2016

(51) Int. Cl.
| | |
|---|---|
| *H01L 33/00* | (2010.01) |
| *H01L 23/495* | (2006.01) |
| *H01L 25/075* | (2006.01) |
| *H01L 23/13* | (2006.01) |

(52) U.S. Cl.
CPC .......... *H01L 23/49575* (2013.01); *H01L 23/13* (2013.01); *H01L 23/4952* (2013.01); *H01L 23/49541* (2013.01); *H01L 25/0753* (2013.01)

(58) Field of Classification Search
CPC ... H01L 33/00; H01L 25/0753; H01L 27/153; H01L 33/20; H01L 33/62
USPC .............................. 257/88, 666, 674; 438/123
See application file for complete search history.

(56) References Cited

U.S. PATENT DOCUMENTS

| | | | | |
|---|---|---|---|---|
| 6,310,388 B1* | 10/2001 | Bissey | .............. | H01L 23/49589 257/532 |
| 6,340,824 B1* | 1/2002 | Komoto | ................ | H01L 33/508 257/100 |
| 2009/0289275 A1* | 11/2009 | Hayashi | .............. | B29C 45/0025 257/99 |
| 2012/0098006 A1 | 4/2012 | Chen et al. | | |
| 2013/0221379 A1* | 8/2013 | Saito | ..................... | H01L 31/167 257/82 |
| 2014/0070383 A1* | 3/2014 | Goida | ................... | B81B 7/0077 257/666 |

OTHER PUBLICATIONS

"*OSLON Black Flat Datasheet, LUW H9QP*," PDF File, Aug. 27, 2014, pp. 1-23, Version 1.8, OSRAM Opto Semiconductors GmbH, www.osram-os.com.

* cited by examiner

*Primary Examiner* — Phuc Dang
(74) *Attorney, Agent, or Firm* — Jenkins, Wilson, Taylor & Hunt, P.A.

(57) ABSTRACT

Leadframe based light emitter components and methods are provided. In some aspects, a leadframe based light emitter component includes a leadframe element, an electrical device connected to a portion of the leadframe element, and a molded cup encasing portions of the leadframe element and the electrical device connected thereto. A method of providing a leadframe based light emitter component includes providing a leadframe element, connecting an electrical device to a portion of the leadframe element, and molding a body over portions of the leadframe element and the electrical device.

31 Claims, 7 Drawing Sheets

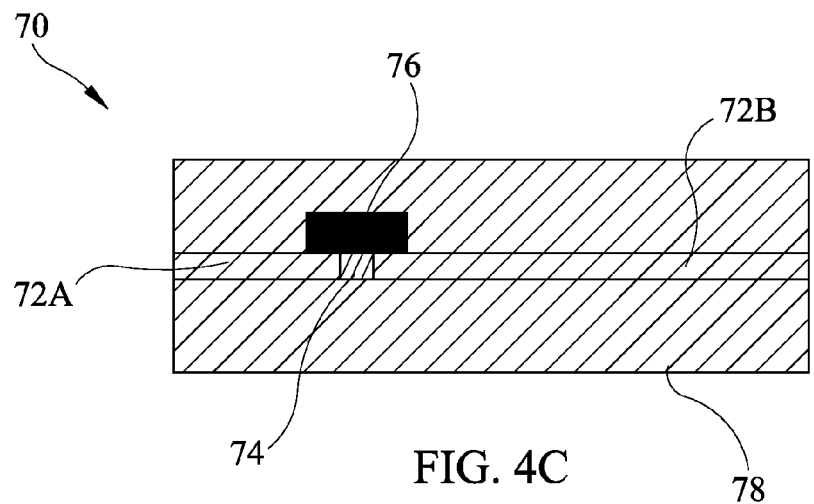
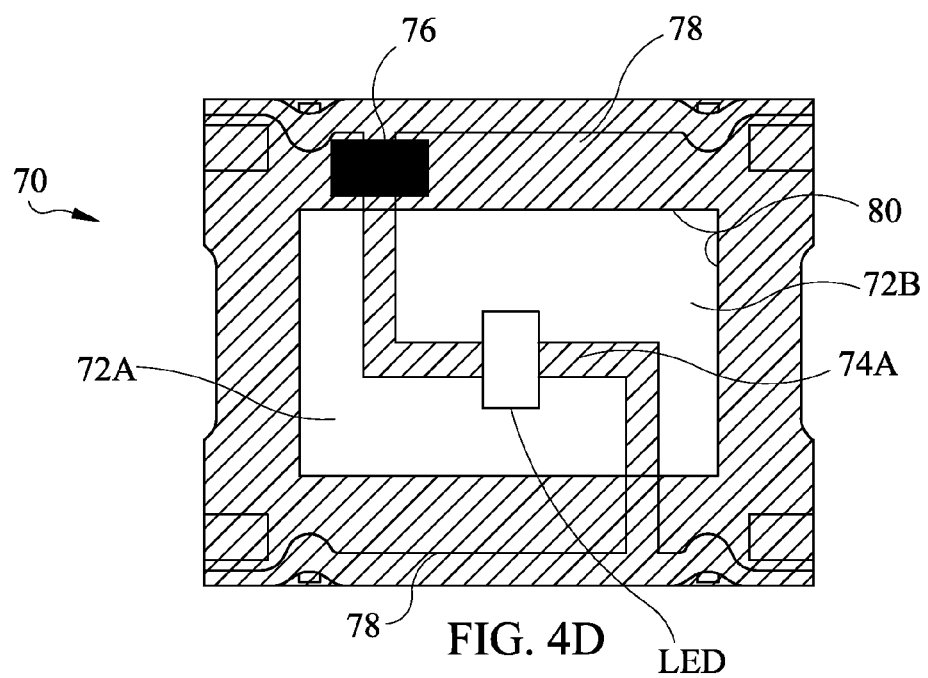

LEADFRAME BASED LIGHT EMITTER COMPONENTS AND RELATED METHODS

TECHNICAL FIELD

The subject matter disclosed herein relates generally to leadframe based components and related methods, and more particularly to leadframe based light emitter components and related methods.

BACKGROUND

Light emitter components, for example, light emitter packages and/or devices, incorporate solid state light emitters, such as light emitting diode (LED) chips. Light emitter components are used in a wide variety of lighting products, fixtures, and/or lighting applications. Designers utilize components having various sizes, shapes, and/or designs in order to accommodate the wide variety of lighting applications, for example, to provide desired electrical and/or optical properties not limited to operability at desired voltages, emission of desired brightness, light density, light output, color, beam size, and/or beam shape.

Some conventional light emitter components utilize a leadframe molded within a plastic body, where the leadframe passes electrical current through the component for illuminating LED chips disposed therein. One problem associated with conventional components is that during molding, the leadframe elements are not structurally supported. In addition, the spacing within the final component is not efficiently utilized. Manufacturers are constantly seeking ways to maximize brightness while providing smaller and smaller components.

Accordingly, a need exists for improved leadframe based light emitter components and related methods.

SUMMARY

The subject matter disclosed herein relates to leadframe based light emitter components and related methods. In one embodiment, a leadframe based light emitter component comprises a leadframe element, an electrical device connected to a portion of the leadframe element, and a molded body, such as for example a molded cup, encasing portions of the leadframe element and at least part or all of the electrical device connected thereto for concealing the electrical device from view and for concealing the electronic object outside of the LED emission profile. In some embodiments, multiple electrical devices are molded or encased within the molded body.

In one embodiment, a method of providing a leadframe based light emitter component is disclosed. The method comprises providing a leadframe element, connecting an electrical device to a portion of the leadframe element, and molding a molded body over portions of the leadframe element and the electrical device for concealing the electrical device from view.

In further embodiments, a leadframe based light emitter component includes a leadframe element, wherein some portions of the leadframe element are disposed within a molded portion, and other portions of the leadframe element are not disposed within the molded body, a light emitting diode (LED) chip attached to an unmolded portion of the leadframe element, and an electrical device connected to the leadframe element and disposed within and covered by the molded body.

Leadframe based light emitter components and methods described herein can provide, for example and without limitation, one or more benefits including a reduced cost, improved manufacturability, improved support during molding, and increased light extraction and brightness. These and other objects are achieved, at least in whole or in part, according to the subject matter disclosed herein.

BRIEF DESCRIPTION OF THE DRAWINGS

A full and enabling disclosure of the present subject matter is set forth more particularly in the remainder of the specification, including reference to the accompanying figures, relating to one or more embodiments, in which:

FIGS. 4A to 4D are illustrations of leadframe based light emitter components according to some aspects;

DETAILED DESCRIPTION

Figure 1A:
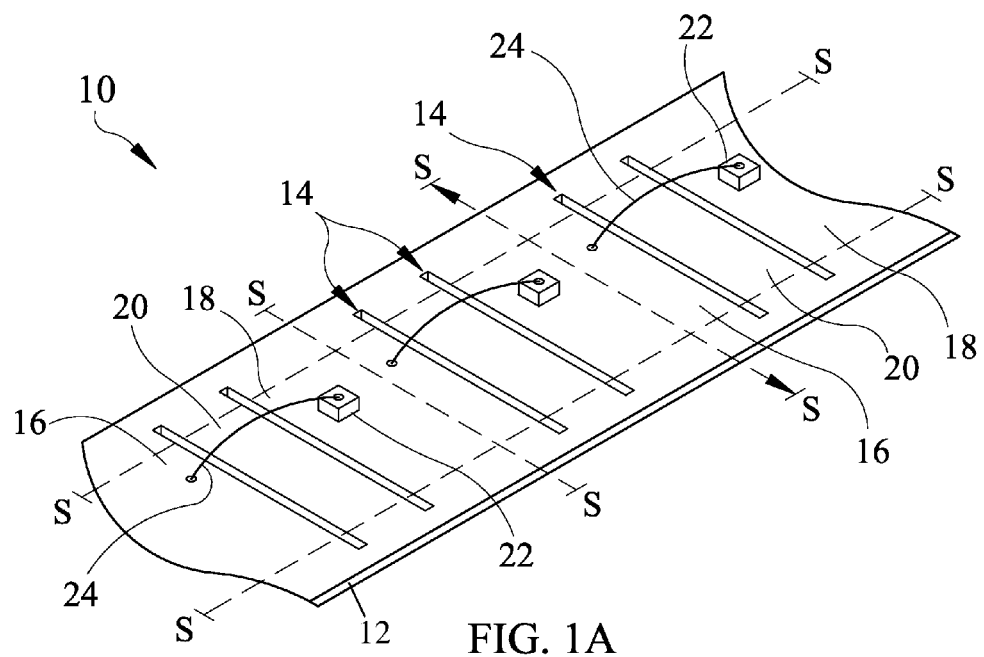
FIGS. 1A and 1B are schematic illustrations of unmolded and molded leadframes, respectively, for use in light emitter components according to some aspects.

The subject matter disclosed herein relates to novel leadframe based light emitter components and related methods.

Each example and/or embodiment described herein is provided to explain the subject matter and not as a limitation. In fact, features illustrated or described as part of one embodiment can be used in another embodiment to yield still a further embodiment. It is intended that the subject matter disclosed and envisioned herein covers such modifications and variations.

As illustrated in the various figures, some sizes of structures or portions may be exaggerated relative to other structures or portions for illustrative purposes and, thus, are provided to illustrate the general structures of the present subject matter and may or may not be drawn to scale. Furthermore, various aspects of the present subject matter are described with reference to a structure or a portion being formed on other structures, portions, or both. As will be appreciated by those of skill in the art, references to a structure being formed "on" or "above" another structure or portion contemplates that additional structure, portion, or both may intervene. References to a structure or a portion being formed "on" another structure or portion without an intervening structure or portion are described herein as being formed "directly on" the structure or portion. Similarly, it will be understood that when an element is referred to as being "connected", "attached", or "coupled" to another element, it can be directly connected, attached, or coupled to the other element, or intervening elements may be present. In contrast, when an element is referred to as being "directly connected", "directly attached", or "directly coupled" to another element, no intervening elements are present.

Furthermore, relative terms such as "on", "above", "upper", "top", "lower", or "bottom" are used herein to describe one structure's or portion's relationship to another structure or portion as illustrated in the figures. It will be understood that relative terms such as "on", "above", "upper", "top", "lower" or "bottom" are intended to encompass different orientations of the package or component in addition to the orientation depicted in the figures. For example, if the package or component in the figures is turned over, structure or portion described as "above" other structures or portions would now be oriented "below" the other structures or portions. Likewise, if the package or component in the figures are rotated along an axis, structure or portion described as "above", other structures or portions would be oriented "next to" or "left of" the other structures or portions. Like numbers refer to like elements throughout.

Unless the absence of one or more elements is specifically recited, the terms "comprising", including", and "having" as used herein should be interpreted as open-ended terms that do not preclude the presence of one or more elements.

The terms "solid state light emitter" or "solid state emitter" refer to an LED chip, a laser diode, an organic LED chip, and/or any other semiconductor device preferably arranged as a semiconductor chip that comprises one or more semiconductor layers, which can comprise silicon, silicon carbide, gallium nitride and/or other semiconductor materials, a substrate which can comprise sapphire, silicon, silicon carbide and/or other microelectronic substrates, and one or more contact layers which can comprise metal and/or other conductive materials.

Solid state emitters according to aspects of the subject matter herein can comprise III-V nitride (e.g., gallium nitride) based LED chips or laser chips fabricated on a silicon, silicon carbide, sapphire, or III-V nitride growth substrate, including (for example) chips manufactured and sold by Cree, Inc. of Durham, N.C. Such LED chips and/or lasers can be configured to operate such that light emission occurs through the substrate in a so-called "flip chip" orientation. Such LED and/or laser chips can also be devoid of growth substrates (e.g., following growth substrate removal).

LED chips useable with lighting components as disclosed herein can comprise horizontal structures (with both electrical contacts on a same side of the LED chip) and/or vertical structures (with electrical contacts on opposite sides of the LED chip). A horizontally structured chip (with or without the growth substrate), for example, can be flip chip bonded (e.g., using solder) to an electrical component (e.g., a leadframe component), or wire bonded. A vertically structured chip (without or without the growth substrate) can have a first terminal solder bonded to a carrier substrate, mounting pad, or printed circuit board (PCB), and have a second terminal wire bonded to the carrier substrate, electrical element, or PCB.

LED chips can be packaged (e.g., within a leadframe based component) for mechanical and environmental protection. Electrically activated light emitters, such as solid state emitters, can be used individually or in groups to emit one or more beams to stimulate emissions of one or more lumiphoric materials (e.g., phosphors, scintillators, lumiphoric inks, quantum dots) to generate light at one or more peak wavelengths, or of at least one desired perceived color (including combinations of colors that can be perceived as white). Inclusion of phosphoric (also called 'luminescent') materials in lighting components as described herein can be accomplished by an application of a direct coating of the material on lumiphor support elements or lumiphor support surfaces (e.g., by powder coating, inkjet printing, or the like), adding such materials to lenses or encapsulant, and/or by embedding or dispersing such materials within lumiphor support elements or surfaces. Methods for fabricating LED chips having a planarized coating of phosphor integrated therewith are discussed by way of example in U.S. Patent Application Publication No. 2008/0179611 to Chitnis et al., the disclosure of which is hereby incorporated by reference herein in the entirety.

In some aspects, one or more short wavelength solid state emitters (e.g., blue and/or cyan LED chips) can be used to stimulate emissions from a mixture of lumiphoric materials, or discrete layers of lumiphoric material, including red, yellow, and green lumiphoric materials. LED chips of different wavelengths can be present in the same group of solid state emitters, or can be provided in different groups of solid state emitters. A wide variety of wavelength conversion materials (e.g., luminescent materials, also known as lumiphors or lumiphoric media, e.g., as disclosed in U.S. Pat. No. 6,600, 175 and U.S. Patent Application Publication No. 2009/ 0184616), are well-known and available to persons of skill in the art.

The term "lighting component" as used herein, is not limited, except that it is capable of emitting light. That is, a lighting component can be a part, device, package, component, circuit element or any other component for illuminating an area or volume, e.g., a structure, a swimming pool or spa, a room, a warehouse, an indicator, a road, a parking lot, a vehicle, signage, e.g., road signs, a billboard, a ship, a toy, a mirror, a vessel, an electronic device, a boat, an aircraft, a stadium, a computer, a remote audio device, a remote video device, a cell phone, a tree, a window, an LCD display, a cave, a tunnel, a yard, a lamppost, or a device or array of devices that illuminate an enclosure, or a device that is used for edge or back-lighting (e.g., backlight poster, signage, LCD displays), light bulbs, bulb replacements (e.g., for replacing AC incandescent lights, low voltage lights, fluorescent lights, etc.), outdoor lighting, security lighting, exterior residential lighting (wall mounts, post/column mounts), ceiling fixtures/ wall sconces, under cabinet lighting, lamps (floor and/or table and/or desk), landscape lighting, track lighting, task lighting, specialty lighting, rope lights, ceiling fan lighting, archival/ art display lighting, high vibration/impact lighting-work lights, etc., mirrors/vanity lighting, or any other light emitting device.

Various illustrative features are described below in connection with the accompanying figures.

Figure 1B:
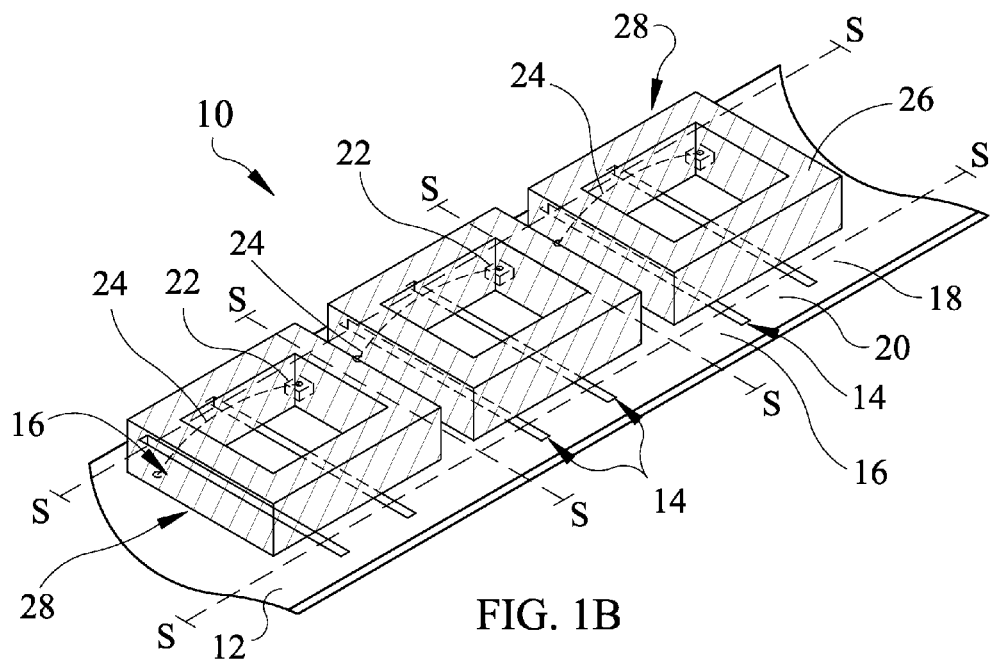

FIGS. 1A and 1B schematically illustrate unmolded and molded leadframes, respectively, for light emitter components according to some aspects. FIG. 1A is a schematic illustrate of a generic leadframe, generally designated 10. Leadframe 10 comprises an electrically conductive body or sheet of material 12, such as for example a metallic sheet of material not limited to copper (Cu), silver (Ag), titanium (Ti), molybdenum (Mo), gold (Au), platinum (Pt), Aluminum (Al), alloys thereof, combinations thereof, and/or any other suitable electrical conductor. Leadframe 10 is configured to be molded within a component body, and pass electrical current or electrical signal into one or more LED chips within (e.g., packaged within) the component.

Leadframe 10 can be stamped, etched, pressed, drilled, machined, or otherwise have portions thereof removed to separate the leadframe into one or more leadframe elements. For example, one or more openings 14 can be provided within leadframe 10 for electrically, thermally, and/or physically separating leadframe 10 into one or more leadframe elements, such as a first leadframe element 16, a second leadframe element 18, and a third leadframe element 20 upon singulation/separation from leadframe 10. For illustration purposes, broken lines are shown over leadframe 10, indicative of singulation lines S. Leadframe 10 may be ultimately sheared, sawn, broken, diced, laser cut, or otherwise separated along lines S, such that first, second, and third leadframe elements 16, 18, and 20, respectively, are physically and electrically discrete within a light emitter component.

Figure 4A:
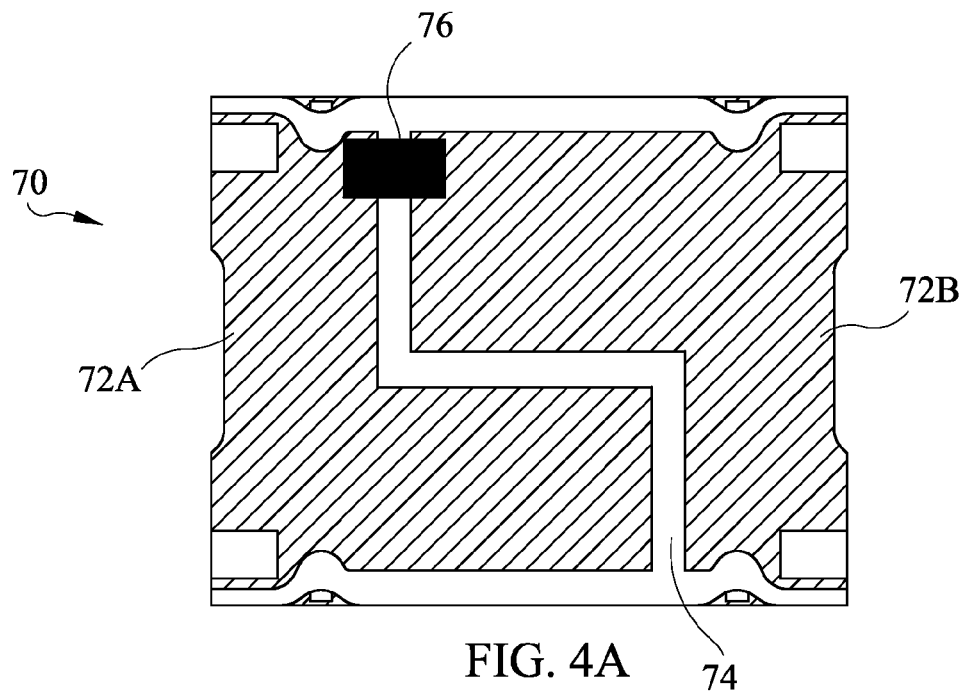
Figure 4B:
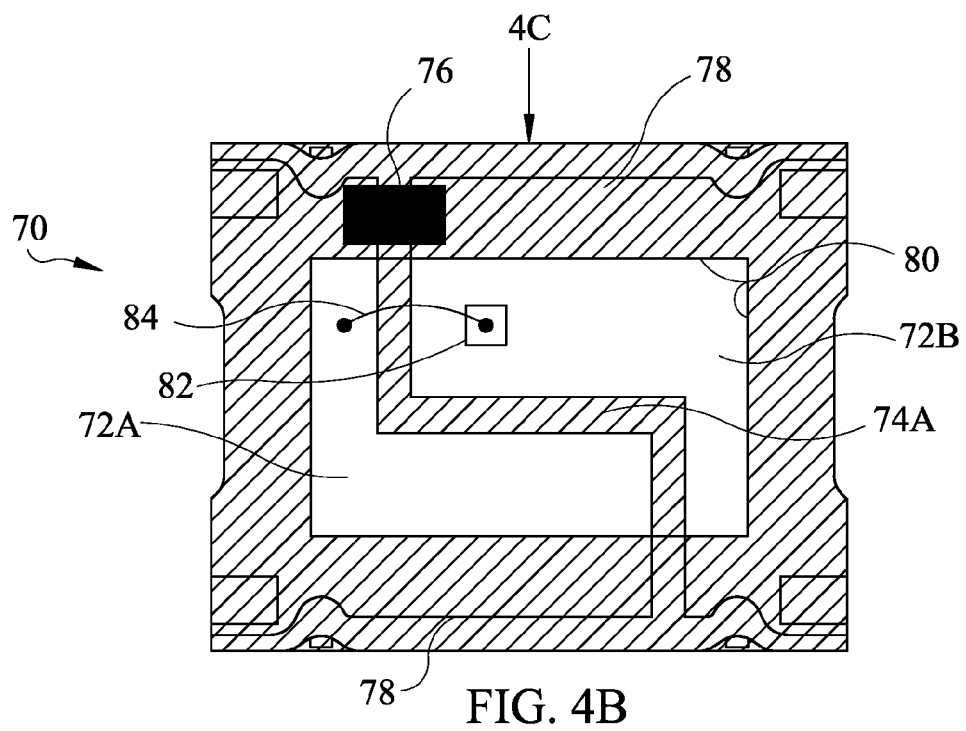

In some aspects, first and second leadframe elements 16 and 18, respectively, can comprise an anode-cathode pair configured to pass electrical current into one or more LED chips (e.g., FIG. 82, FIG. 4B). LED chips (82, FIG. 4B) can be mounted to third leadframe element 20, which can comprise a thermally conductive heat sinking element.

An electrical device 22 can be mounted to one leadframe element 18 and optionally wire bonded to another leadframe element 16. Electrical device 22 can for example comprise any suitable physical or electrical component not limited to one or more electrostatic discharge (ESD) devices (e.g., Zener diodes, surface mount varistors, vertical silicon (Si) diodes, reverse biased LED chips, etc.), a resistor, a surge protection device, a rectifier, a capacitor, a thermistor, an invertor, a transistor, a wire, a lead, a socket, a connector, etc. ESD and surge protection devices are configured to protect light emitters (LED chips) from spikes or surges in voltage while the chips are operating. Electrical device or devices 22 can be physically connected to leadframe 10 via electrical connectors, such as wires 24. Electrical device or devices 22 may be non-light emitting devices.

Notably, electrical devices 22 can be attached to leadframe 10 prior to a molding process, in which leadframe 10 is molded within and retained by a plastic body structure. By attaching electrical devices 22 to leadframe 10 prior to molding, the stability of the leadframe elements (e.g., 16, 18, 20) during molding improved as electrical device 22 provides physical support for leadframe elements (e.g., 16, 18, 20) by virtue of being physically mounted and/or connected thereto. Electrical devices 22 can also be attached to leadframe 10 and molded within a component body prior to die attaching LED chips over portions thereof.

Referring now to FIG. 1B, portions of leadframe 10 and/or electrical devices 22 can each be molded within a molded body, for example, a body that can be in the form of a molded cup or any other suitable shape or configuration. The molded body can comprise and suitable material, such as for example, plastic, polymeric material, silicone material, epoxy material, sheet molding compound (SMC) plastic, epoxy molding compound (EMC), combinations thereof, and/or any other type of material capable of being dispensed, molded (e.g., hybrid materials), and/or optionally cured or set into a molded shape around (about) portions of leadframe 10. As FIG. 1B illustrates, a body 26 can be molded about, engage, and/or retain portions of leadframe 10 and electrical devices 22, for at least partially encasing and covering portions of leadframe 10 and at least partially or completely encasing and covering electrical devices 22. Individual light emitter components 28 can then be singulated from adjacent components 28 along singulation lines S, which are illustrated in broken lines for illustration purposes. That is, leadframe 10 and electrical devices 22 attached thereto can be simultaneously molded within portions of body 26, for at least partially encapsulating devices 22 within the molded structure or body 26, such as a molded wall of a light emitter component.

For clarity and illustration purposes, body 26 is shown in hatched lines, however body 26 may optionally be opaque, white, clear, or transparent, where desired, for providing any desired beam shape, size, and/or pattern of light upon illumination of one or more LED chips (e.g., 82, FIG. 4B) contained thereon. Body structure 26 can comprise top, bottom, and side surfaces or walls of each light emitter component 28, and may also be disposed within openings between leadframe elements 16, 18, and 20. Body 26 can be reflective, non-reflective, light blocking and/or light transmitting, where desired. Body 26 can define a reflective cavity having a cavity floor. One or more LED chips (e.g., 82, FIG. 4B) can be mounted within the cavity of body 26 to the cavity floor for emitting light from each component 28.

Figure 2A:
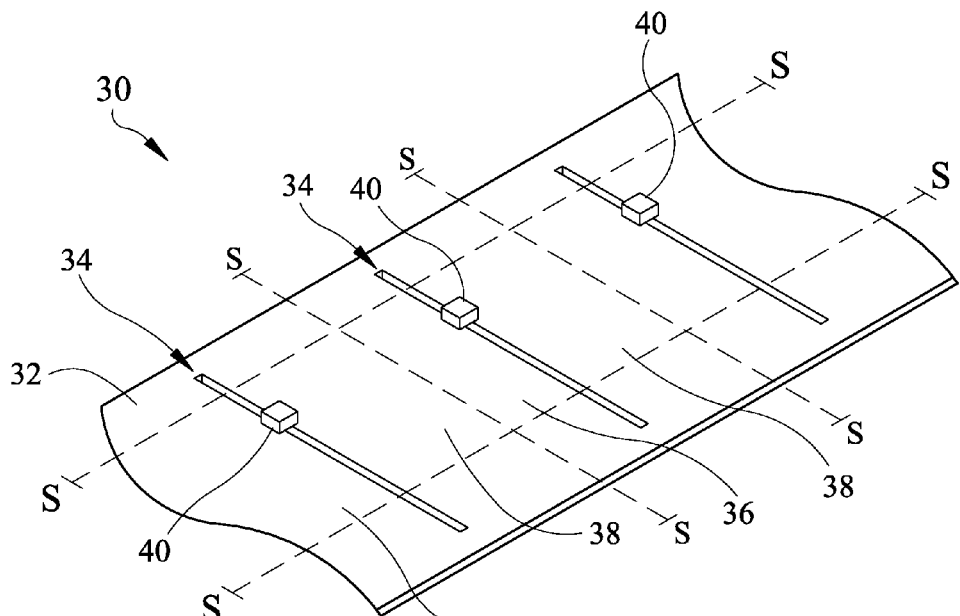
FIGS. 2A and 2B are schematic illustrations of unmolded and molded leadframes, respectively, for use in light emitter components according to some aspects.
Figure 2B:
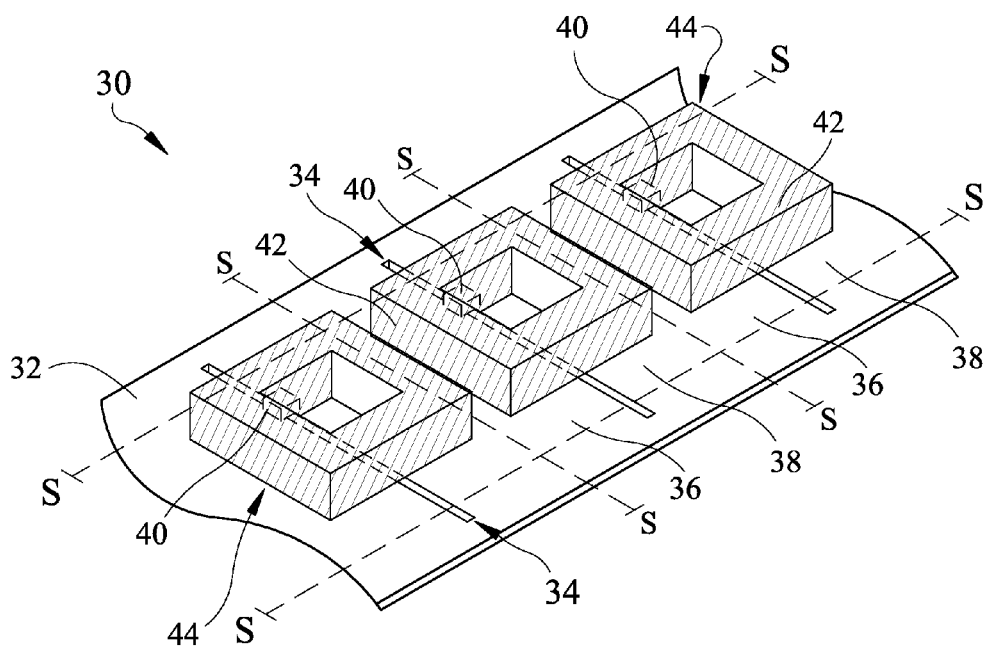

FIGS. 2A and 2B schematically illustrate other embodiments of unmolded and molded leadframes, respectively, of light emitter components according to some aspects. FIGS. 2A and 2B are similar to 1A and 1B, with the exception of the placement of the electrical device to be molded within portions of the light emitter component.

FIG. 2A is a schematic illustrate of a generic leadframe, generally designated 30. Leadframe 30 comprises an electrically conductive body or sheet of material 32, such as a metal or metal alloy. One or more slits, apertures, or openings 34 can be formed (e.g., via stamping, etching, pressing, drilling, machining, etc.) within leadframe 30 to physically and electrically separate the leadframe into one or more discrete leadframe elements. During molding, openings 34 can become filled with plastic (e.g., body material) for retaining leadframe 30, or portions thereof. In one embodiment, one or more openings 34 can be provided within leadframe 30, for electrically, thermally, and/or physically separating the sheet into one or more leadframe elements, such as a first leadframe element 36 and a second leadframe element 38.

For illustration purposes, broken lines are shown over leadframe 30, which are indicative of singulation lines S. Leadframe 30 may be ultimately sheared, sawn, laser cut, broken, or otherwise separated along lines S, such that first and leadframe elements 36 and 38 respectively, are physically and electrically discrete within a light emitter component. First and second leadframe elements 36 and 38, respectively, can comprise an anode-cathode pair configured to pass electrical current into one or more LED chips (e.g., 82, FIG. 4B) electrically connected thereto.

One or more electrical device 40 can physically and electrically attach to portions of each of first and second elements 36 and 38, respectively. Electrical device 40 can comprise any suitable device not limited to one or more ESD devices, resistors, rectifiers, capacitors, thermistors, invertors, transistors, and/or physical components such as wires, leads, sockets, connectors, etc. In some aspects, each device 40 comprises a horizontal device having both bond pads disposed on a same face (e.g., a bottom surface thereof) for electrically contacting each leadframe element directly. This obviates the need for electrical connectors (e.g., wires or wire bonds) shown in FIGS. 1A and 1B. In this embodiment, electrical devices 40 are configured to directly contact and electrically communicate with each leadframe element 36 and 38 prior to molding, in part for providing a more stable structure during molding. Electrical device 40 can be reverse biased with respect to LED chips (e.g., 82, FIG. 4B) in some aspects, and molded within a body structure comprised of a light emitter component wall.

Referring now to FIG. 2B, portions of leadframe 30 and/or electrical devices 40 can each be molded within a body, for example, a molded body such as a cup that can be plastic, polymeric, silicone, and/or epoxy around (about) portions of leadframe 30 for retaining leadframe elements 36 and 38. As FIG. 2B illustrates, a body 42 can be molded about portions of leadframe 30 and electrical devices 40 for at least partially encasing and covering portions of leadframe 30 and electrical devices 40. In some aspects, electrical device 40 is fully encased and covered by body 42 other than at the leadframe element to which the electrical device is connected. This approach also maintains electrical devices such as electrical device 40 outside of the LED emission profile. Individual components 44 can then be singulated from other, adjacent components 44 along singulation lines S, which are illustrated in broken lines for illustration purposes. In some aspects, portions of leadframe 30 (e.g., including leadframe elements 36, 38), and electrical devices 40 attached thereto, are simultaneously molded within a same material to form a molded wall and/or surface of light emitter components 44. Electrical devices 40 can extend over (traverse) a gap (e.g., opening 34) to contact opposing electrical elements 36 and 38. Openings 34 become filled with cup material (e.g., plastic, polymeric, epoxy, silicone, etc.) during molding to electrically separate opposing electrical elements 36 and 38.

Figure 3A:
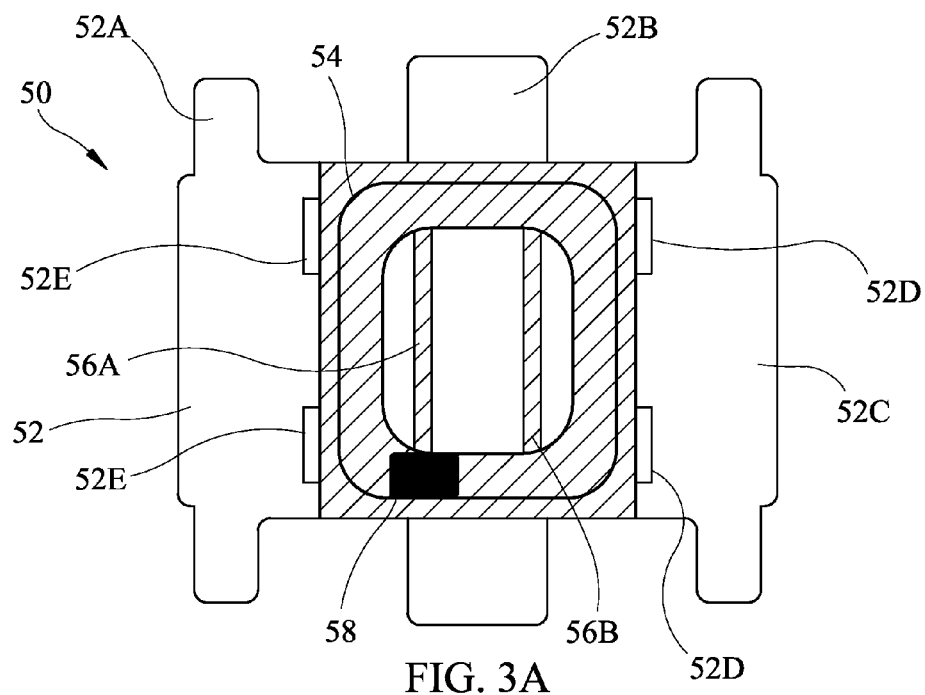
FIGS. 3A and 3B are illustrations of leadframe based light emitter components according to some aspects.
Figure 3B:
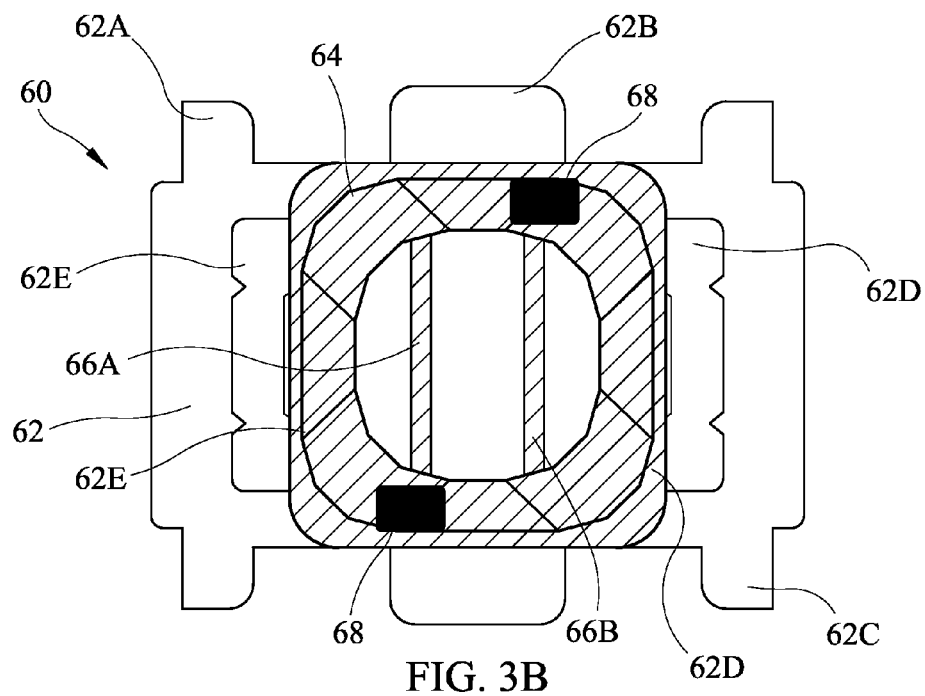

FIGS. 3A and 3B illustrate embodiments of leadframe based light emitter components 50 and 60, respectively. For illustration purposes, the hatched areas in FIGS. 3A and 3B indicate molded areas, including a molded body, shown as a molded cup, and interior regions which separate portions of the leadframe. Light emitter components 50 and 60 can comprise light emitter packages, for providing mechanical, chemical, and/or environmental protection to one or more LED chips (e.g., 82, FIG. 4B). FIGS. 3A and 3B illustrate novel components having one or more electrical devices attached to various portions of leadframe elements prior to molding, such that upon molding, the electrical devices are molded within the body (e.g., wall, cavity structure, etc.) of the component. For illustration purposes, two leadframe/component designs are illustrated in FIGS. 3A and 3B, however, light emitter components may include components of any size, shape, design, and/or leadframe structure such as those available, for example, from Cree, Inc. of Durham, N.C. Components are discussed by way of example in commonly owned and assigned U.S. Pat. No. 7,923,739 to Hussell, the disclosure of which is hereby incorporated by reference herein in the entirety. FIG. 3A illustrates a top view of a first light emitter component 50, which is leadframe based. Component 50 comprises a leadframe 52 and a body 54 molded about portions of leadframe 52. As noted above, leadframe 52 can comprise any electrically conductive material, not limited to metals and/or metal alloys. Body 54 can comprise an electrically isolating or electrically insulating material (i.e., non-electrically conductive material) for physically, thermally, and/or electrically separating leadframe 52 into different, electrically discrete portions, such as leadframe elements. Leadframe 52 can be physically and electrically separable into a first leadframe element 52A, a second leadframe element 52B, and a third leadframe element 52C. Extraneous portions of each element may be removed (e.g., via shearing, scribing, cutting, etc.) after molding and bent to form J-bend or gull wing type surface mount portions 52D and 52E extending from molded body 54. Removing extra metal allows for a component having a smaller, more dimensionally compact footprint. Surface mount portions 52D and 52E can electrically and/or thermally connect component 50 to an electrical power source, circuit (e.g., PCB, metal-core PCB), heat sink, etc., and can pass electrical current though component 50 thereby illuminating the LED chips packaged therein (e.g., 82, FIG. 4B).

During molding of component body 54, portions of the plastic material (e.g., SMC or EMC), polymeric material, silicone material, or epoxy material can flow into one or more spaces disposed between leadframe elements, to electrically, physically, and/or thermally isolate or separate leadframe elements 52A, 52B, and 52C form each other. For example, during molding, material can flow into and occupy isolating portions 56A and 56B of the body 54. Isolating portions 56A and 56B of body 54 can physically, electrically, and/or thermally separate portions of second leadframe element 52B from adjacent leadframe elements, namely 52A and 52C.

Prior to molding body 54, an electrical device 58 can be die attached to one or more portions of component 50, such that it is present prior to and during molding of body 54. Electrical device 58 may be directly attached to one or more leadframe elements 52A to 52C, or wire bonded thereto. Electrical device 58 can comprise any style of ESD chip, or any other electrical device such as for example a resistor, diode, rectifier, capacitor, thermistor, invertor, transistor, surge protection circuitry, ESD devices, and/or physical components (e.g., wires, connectors, sockets, etc.). Notably, once molded within body 54, electrical device or devices 58 can be completely covered and not visible from outside of component 50, within the component cavity, and/or within the visible region of component 50. Electrical device 58 is attached to leadframe 52 prior to the body molding step, and prior to molding the encapsulating body material about electrical device 58. This provides structural support for component 50 by holding leadframe elements 52A and 52B together during molding. In addition, the negative effect on package brightness from an exposed electrical device 58 will be non-existent, as the electrical device 58 is encapsulated (covered) by the molded body having a molded body 54. Body 54 can comprise a molded cup having any suitable shape about the visible area (e.g., substantially square, rounded, elliptical, or any other geometric shape of any height and/or density/porosity). Body 54 can also be molded into and form any other suitable shape or configuration.

FIG. 3B illustrates a top view of another light emitter component 60, which is leadframe based. Component 60 comprises a leadframe 62 and a body 64 molded about portions of leadframe 62. Leadframe 62 can comprise any electrically conductive material. Body 64 can comprise an electrically isolating or electrically insulating material (i.e., non-electrically conductive material) for physically, thermally, and/or electrically separating leadframe 62 into different, electrically discrete portions, or leadframe elements. Leadframe 62 can be physically and electrically separable into a first leadframe element 62A, a second leadframe element 62B, and a third leadframe element 62C. Extraneous portions of each element may be removed (e.g., via shearing, scribing, cutting, etc.) after molding and bent to form J-bend or gull wing type surface mount portions 62D and 62E extending from molded body 64. Removing extra metal allows for a component having a more compact footprint. Surface mount portions 62D and 62E can electrically and/or thermally connect component 60 to an electrical power source, circuit (e.g., PCB, metal-core PCB), heat sink, etc., and can pass electrical current though component 60 thereby illuminating the LED chips packaged therein (e.g., 82, FIG. 4B).

During molding, material for forming body 64 can flow into slits or openings (e.g., 14, FIG. 1A), which are stamped or punched within leadframe 62, for forming insulating body portions 66A and 66B. Portions 66A and 66B can electrically, physically, and/or thermally isolate leadframe elements 62A, 62B, and 62C from each other. LED chips (e.g., 82, FIG. 4B) can be disposed over one leadframe element (e.g., 62B) and wire bonded to each other leadframe element (e.g., 62A, 62B) via wire bonds as shown and described for example in U.S. Pat. No. 7,923,739 (the disclosure of which is incorporated by reference above).

Body 64 can be molded about at least one, and in some aspects multiple electrical devices 68. Each electrical device 68 can attach to multiple leadframe elements directly, or via wire bonds. When directly attached, electrical devices 68 are configured to extend, without any wire bonds, across at least one gap (e.g., portions 66A and 66B), which is formed of plastic or non-electrically conductive body material (e.g., polymer, epoxy, silicone, etc.). Each of electrical devices 68 is fully, or at least partially, encapsulated within a wall of component 60, for example, within a cavity wall of component 60 adjacent a mounting surface for one or more LED chips (e.g., e.g., 82, FIG. 4B) and outside of the LED light emission profile or path as electrical devices 68 may tend to block, absorb or otherwise adversely affect light emission. By molding devices 68 within walls of component 60, the adverse affects can be removed or negated thereby providing brighter devices with optionally larger light emission areas. That is, by molding devices 68 within body 64, the space within component 60 is more efficiently utilized, advantageously increasing the amount of space available for die attaching LED chips (e.g., 82, FIG. 4B). Electrical devices 68 can be molded within multiple, optionally opposing walls of device 60. More than two electrical devices 68 can be molded within device 60, as needed.

FIGS. 4A to 4D illustrate another embodiment of a leadframe based light emitter component, generally designated 70. FIG. 4A illustrates a leadframe component, pre-cup mold. In FIG. 4A, the hatched area represents metal and the white area represents a void (e.g., a slit or opening, FIG. 1A) or space that is devoid of material. Component comprises a first leadframe element 72A and a second, opposing leadframe element 72B. A trench or gap 74 is disposed between the opposing leadframe elements 72A and 72B.

Prior to molding a body about leadframe elements 72A and 72B, one or more electrical device 76 is die attached to portions of first and second leadframe elements 72A and 72B, respectively. Electrical device 76 traverses or extends across gap 74, thereby providing improved stability (e.g., structural support) during molding. Electrical device 76 can be die attached to each leadframe element via any suitable material, including and not limited to solder, epoxy, silicone, AuSn solder, Ag epoxy, SnAg solder paste, eutectic die attach, flux, solder bumps, or any other desired die attach material. Electrical device 76 may also be wire bonded to one or more leadframe elements 72A and 72B, depending upon the leadframe and/or component design.

In some aspects, electrical device 76, and devices described above, can comprise physical components which are molded and concealed within a portion of a molded body 78. That is, electrical device 76 can comprise electrical components such as ESD chips, resistors, rectifiers, etc., or physical components including wires, leads, sockets, connectors, etc. Electrical device 76 can comprise any suitable electrical and/or physical component molded within a portion of body 78.

FIGS. 4B and 4C illustrate component 70 after molding the body (e.g., cup-molding) about leadframe and leadframe elements 72A and 72B. In FIG. 4C and for illustration purposes, the hatched area represents the molded cup or molded body, and the white area represents a cavity floor, which is disposed between cavity walls, and over which at least one LED chip is mounted.

As FIG. 4B illustrates, electrical device 76 is disposed within a wall of the molded cup or body 78. Body 78 comprises plastic, SMC plastic, EMC, silicone, or any other suitable material which is dispensed or molded and optionally cured. Electrical device 76 is at least partially, and in some aspects fully disposed, within body 78 so that no portion is visible in the visible cavity floor, which is disposed between a plurality of cavity walls or body/cup walls 80.

One or more LED chips 82 are die attached after molding. FIG. 4B illustrates at least one chip 82, which is wire bonded via an electrical connector 84, and FIG. 4D illustrates a "directly attached" light emitter chip "LED" which is devoid of wire bonds as described below. At least one chip 82 is attached directly to one leadframe element (e.g., 72B) and wire bonded to the opposing leadframe element (e.g., 72A). Thus, chip 82 can comprise a vertically structured LED, having electrical contacts (e.g., bond pads) disposed on opposite surfaces so that electrical signal vertically passes/flows through chip 82. Horizontally structured devices (e.g., LED, FIG. 4B) can also be provided within component 70. A plurality and/or an array of chips 82 may be provided.

In some embodiments during molding, the plastic or epoxy flows into gap 74 (FIG. 4A) and fills it with material to form an intermediate, dividing portion 74A. Intermediate portion 74A isolates or separates first leadframe element 72A physically, electrically, and/or thermally from second leadframe element 72B. In some aspects, electrical device 76 is obscured from view via body 78. Body 78 can comprise a molded structure that is clear, transparent, opaque, white, and/or combinations thereof. One or more phosphors may also be disposed within body 78, or portions thereof. LED chips 82 can comprise any solid state lighting apparatus configured to emit blue, red, green, cyan, amber, orange, yellow, or white light. A plurality of LED chips 82 can be provided within the cavity of body 78, where desired.

FIG. 4C is a side view of component 70. As FIG. 4C illustrates, electrical device 76 is fully covered and/or encapsulated within a molded body 78. This conceals electrical device 76 from view and conceals the electronic object outside of the LED emission profile, thereby providing brighter components. In addition, during molding, body 78 conforms to a size/shape of a mold and is more than a mere coating applied to electrical device 76. Instead, device 76 is embedded within a molded wall or structure, so that the height of the molded wall or structure is independent from the size and shape of the electrical device being molded therein. The size and shape of the wall can conform to the mold.

FIG. 4D is an alternative and/or additional embodiment of component 70, in which at least one directly attached, also referred to as direct attached, LED chip, generally designated LED is provided and directly attached to each leadframe element 72A and 72B. Electrical device 76 can be attached first, and LED may be provided and die attached directly to each element 72A and 72B either prior to molding or after molding body 78 about each leadframe element 72A and 72B and electrical device 76. LED is configured to and traverses and extends over a trench or gap (e.g., 74, FIG. 4A) and respective intermediate body portion 74A for physically and electrically connecting to portions of each leadframe element 72A and 72B.

LED can comprise a horizontally structured chip configured to directly eclectically communicate with each leadframe element 72A and 72B via bond pads on a same (e.g., bottom surface) of LED. Thus, the direct attached LED obviates the need for any additional processing associated within wire bonding. In addition, a direct attached LED further improves stability of the leadframe elements 72A and 72B during the molding process, thereby providing a more robust component 70. Any suitable material can be used to die attach LED to portions of each leadframe element 72A and 72B, for example, and not limited to silicone, epoxy, Ag epoxy, solder, AuSn solder, Sn solder, adhesive, paste, solder bumps, etc. As shown in FIG. 4D, component 70 can include two structures that bridge the gap (74 shown in FIG. 4A) and therefore provide increased stability to the leadframe elements, where one structure is the electrical device 76 that is at least partially or completely covered by molding body 78, and where the other structure is LED that is not covered by molding body 78.

Figure 5:
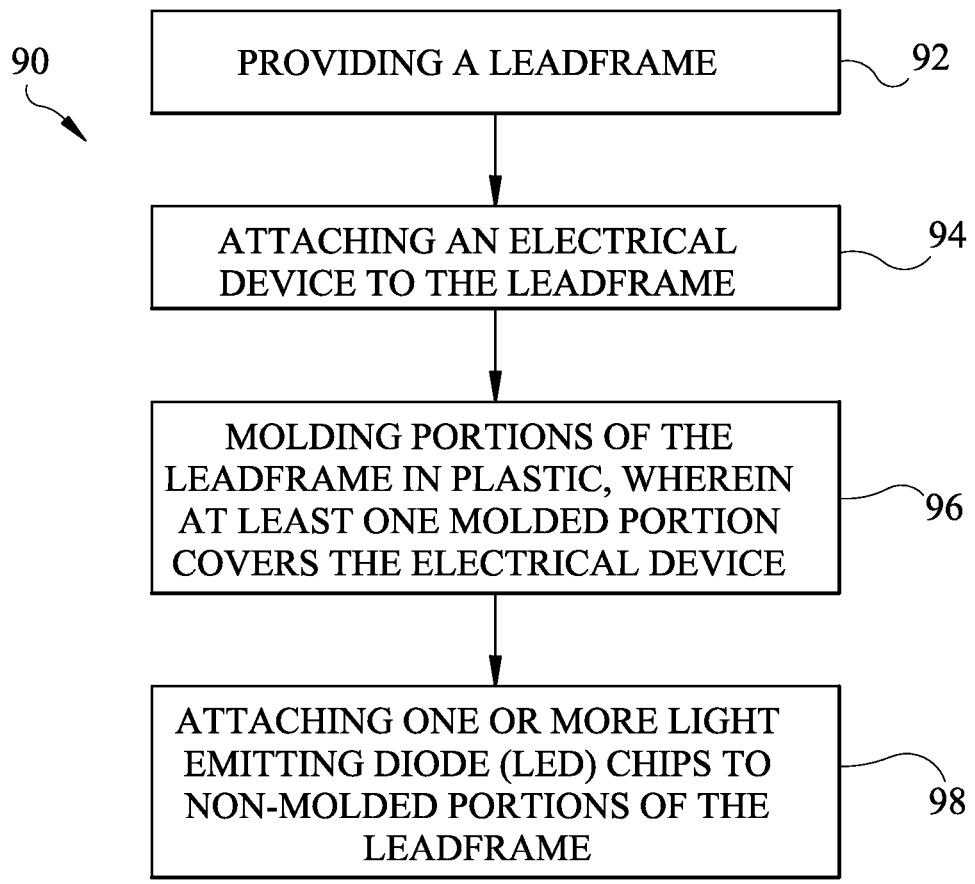
FIG. 5 is a block diagram illustrating an exemplary method relating to leadframe based light emitter components according to some aspects.

FIG. 5 is a block diagram illustrating an exemplary method, generally designated 90, for providing a leadframe based light emitter component according to some aspects. In block 92, a leadframe is provided. In block 94, an electrical device, such as an ESD protection device, a surge protection device, etc., is attached to the leadframe, or portions (e.g., leadframe elements) thereof. The electrical device may be directly attached to the leadframe, or wire bonded.

In block 96, portions of the leadframe are molded in plastic, epoxy, or silicone materials, or derivatives thereof. At least one molded portion encapsulates the electrical device. Other portions of the leadframe may not be molded, and serve as a mounting surface for die attaching one or more LED chips. In block 98, the one or more LED chips are attached after molding, to non-molded portions of the leadframe.

Components described herein can comprise any suitable size and/or shape. For example, components can have lengths and/or widths of: approximately 1 millimeters (mm)×1 mm; 2 mm×2 mm; 3 mm×3 mm; 5 mm×5 mm; 5 mm×6 mm; 5 mm×7 mm; 7 mm×7 mm; or any other suitable measurement. Components can for example comprise devices having a substantially square footprint, a substantially rectangle footprint, a substantially round footprint, a non-square footprint, a non-rectangular footprint, an irregular footprint, a regular footprint, a symmetrical footprint, and/or an asymmetrical footprint. Wall heights (e.g., covering electrical device) can for example be: approximately 0.25 mm or more; 0.5 mm or more; approximately 1 mm or more; or more than 2 mm. Components disclosed herein can emit any desired color of light, for example, blue, red, green, cyan, amber, orange, yellow, white (cool to warm), and/or combinations thereof.

Figure 6:
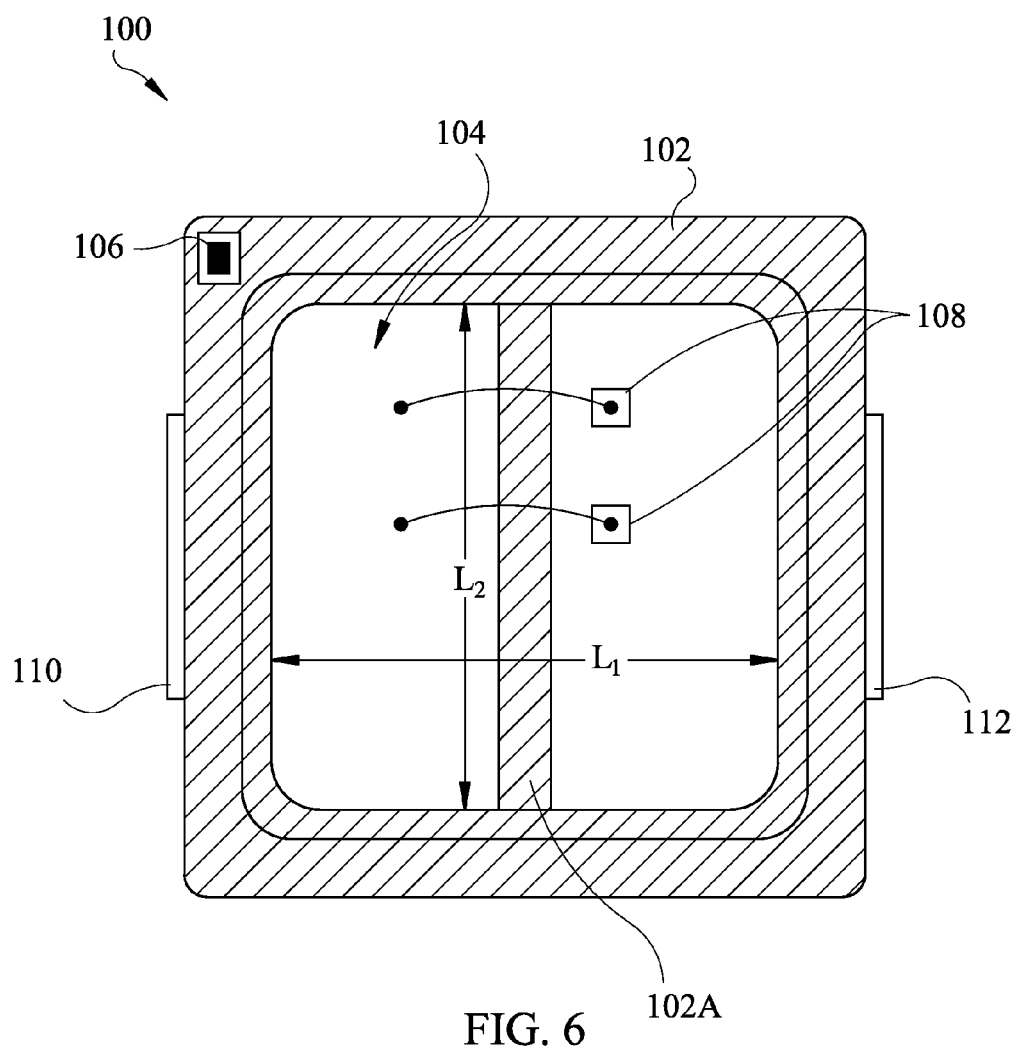
FIG. 6 is a further illustration of a leadframe based light emitter component according to some aspects.

FIG. 6 is a top view of a further embodiment of a leadframe based light emitter component, generally designated 100. Component 100 comprises a plurality of leads molded within a body 102 and separated from a leadframe. Portions 110 and 112 of each lead can extend from outermost edges of component 100 for providing SMD type mounting pads.

In some embodiments, component 100 comprises a cavity defining a mounting area or space 104, which may not be molded within body 102. Mounting space 104 can comprise adjacent leads (e.g., forming an anode/cathode pair) and an insulating portion 102A of the body 102 disposed between the leads. One or more LED chips 108 are attached to leads, and the LED chips 108 may be directly attached to each lead or wire bonded as shown. At least one electrical device 106 can be disposed within the molded body 102. Electrical device 106 may be provided in an opening of body 102 for electrically contacting portions of the leads. In this embodiment, electrical device 106 is surrounded on four sides by body 102, but may not be fully covered. For example, a top surface of electrical device 106 can remain uncovered. In this embodiment, electrical device 106 is disposed within the molded body 102, for providing the electrical device outside of the LED emission profile, and outside of the visual mounting space 104.

Mounting space 104 can comprise a visible, non-molded area of component in which at least one or more LED chips are 108 are provided. Mounting space 104 can comprise any size and/or shape. As shown, mounting space 104 comprises a first length L1 and a second length L2. Notably, electrical device 106 does not overlap any part of mounting space 104, thus, electrical device 106 is concealed from view so that it does not interfere with the light emission profile.

Leadframe based light emitter components methods as disclosed herein can provide, for example and without limitation, one or more of the following beneficial technical effects: improved manufacturability; improved light extraction; improved brightness; improved stability during processing; increased cavity floor for provision of a greater number of LED chips and/or larger LED chips; and/or more optimized space utilization.

While the subject matter has been has been described herein in reference to specific aspects, features, and illustrative embodiments, it will be appreciated that the utility of the subject matter is not thus limited, but rather extends to and encompasses numerous other variations, modifications and alternative embodiments, as will suggest themselves to those of ordinary skill in the field of the present subject matter, based on the disclosure herein.

Various combinations and sub-combinations of the structures and features described herein are contemplated and will be apparent to a skilled person having knowledge of this disclosure. Any of the various features and elements as disclosed herein can be combined with one or more other disclosed features and elements unless indicated to the contrary herein. Correspondingly, the subject matter as hereinafter claimed is intended to be broadly construed and interpreted, as including all such variations, modifications and alternative embodiments, within its scope and including equivalents of the claims.

What is claimed is:

1. A leadframe based light emitter component comprising:
a leadframe element;
at least one light emitting diode (LED) chip connected to a first portion of the leadframe element;
an electrical device connected to a second portion of the leadframe element; and
a molded body disposed around the first portion of the leadframe element and the LED chip connected thereto, wherein the molded body encases the second portion of the leadframe element and a portion of the electrical device connected thereto.

2. The component of claim 1, wherein the electrical device is fully encased by the molded body other than at the leadframe element to which the electrical device is connected.

3. The component of claim 1, wherein the electrical device comprises a non-light emitting device.

4. The component of claim 1, wherein the electrical device comprises one or more of an electrostatic discharge (ESD) protection device, a surge protection device, a resistor, a rectifier, a capacitor, a thermistor, an inverter, a transistor, a wire, a lead, a socket, and/or a connector.

5. The component of claim 1, wherein the electrical device is wire bonded to the leadframe element.

6. The component of claim 1, wherein the electrical device is directly attached to two or more portions of the leadframe element.

7. The component of claim 1, wherein the molded body comprises plastic, polymer, silicone, epoxy, sheet molding compound (SMC), and/or epoxy molding compound (EMC).

8. The component of claim 1, wherein the molded body comprises a molded cup.

9. The component of claim 1, wherein the molded body is transparent.

10. The component of claim 1, wherein the molded body is opaque.

11. The component of claim 1, wherein the at least one LED chip is configured to emit light that is blue, red, or green.

12. The component of claim 1, further comprising multiple light emitting diode (LED) chips electrically connected to the leadframe element.

13. The component of claim 1, further comprising multiple electrical devices connected to multiple leadframe elements, wherein the molded body comprises a molded cup that encases portions of the multiple leadframe elements and multiple electrical devices attached to the leadframe elements such that the multiple electrical devices are concealed from view.

14. A method of providing a leadframe based light emitter component, the method comprising:
providing a leadframe element;
connecting at least one light emitting diode (LED) chip to a first portion of the leadframe element;
connecting an electrical device to a second portion of the leadframe element; and
molding a body around the first portion of the leadframe element and the LED chip connected thereto, and molding the body over the second portion of the leadframe element and the electrical device connected thereto.

15. The method of claim 14, wherein the electrical device comprises a non-light emitting device.

16. The method of claim 14, wherein the electrical device comprises one or more of an electrostatic discharge (ESD) protection device, a surge protection device, a resistor, a rectifier, a capacitor, a thermistor, an inverter, a transistor, a wire, a lead, a socket, and/or a connector.

17. The method of claim 14, further comprising wire bonding the electrical device to the leadframe element.

18. The method of claim 14, further comprising directly attaching the electrical device to two or more portions of the leadframe element.

19. The method of claim 14, wherein molding the molded body comprises molding a body from plastic, polymer, silicone, epoxy, sheet molding compound (SMC), and/or epoxy molding compound (EMC).

20. The method of claim 14, wherein the molded body is opaque.

21. The method of claim 14, wherein the molded body is transparent.

22. The method of claim 14, wherein the at least one LED chip is configured to emit light that is blue, red, or green.

23. The method of claim 14, further comprising connecting a plurality of electrical devices to a plurality of leadframe elements, and molding the molded body as a molded cup over at least portions of the plurality of electrical devices and the plurality of leadframe elements.

24. A leadframe based light emitter component comprising:
a leadframe element, wherein some portions of the leadframe element are disposed within a molded cup and other portions of the leadframe element are disposed outside of the molded cup;
a light emitting diode (LED) chip attached to an unmolded portion of the leadframe element; and
an electrical device connected to the leadframe element and disposed within and covered by the molded cup.

25. The component of claim 24, wherein the electrical device is a non-light emitting device.

26. The component of claim 24, wherein the electrical device comprises one or more of an electrostatic discharge (ESD) protection device, a surge protection device, a resistor, a rectifier, a capacitor, a thermistor, an inverter, a transistor, a wire, a lead, a socket, and/or a connector.

27. The component of claim 24, further comprising two or more electrical devices attached to the leadframe element and disposed within and covered by the molded cup.

28. The component of claim 24, wherein the light emitting diode (LED) chip attached to an unmolded portion of the leadframe element is a wire bonded light emitting diode (LED) chip.

29. The component of claim 24, wherein the light emitting diode (LED) chip attached to an unmolded portion of the leadframe element is a direct attach light emitting diode (LED) chip that bridges a gap between portions of the leadframe element.

30. A leadframe based light emitter component comprising:
multiple leadframe elements;
multiple electrical devices connected to the multiple leadframe elements; and
a molded body comprising a molded cup, wherein the molded body encases portions of the multiple leadframe elements and the multiple electrical devices attached to the multiple leadframe elements such that the multiple electrical devices are concealed from view.

31. A method of providing a leadframe based light emitter component, the method comprising:
providing a plurality of leadframe elements;
connecting a plurality of electrical devices to the plurality of leadframe elements; and
molding a body comprising a molded cup, wherein the molded body is disposed over at least portions of the plurality of electrical devices and the plurality of leadframe elements such that the plurality of electrical devices are concealed from view.

* * * * *